United States Patent [19]
Ohannes et al.

[11] Patent Number: 5,331,224
[45] Date of Patent: Jul. 19, 1994

[54] $I_{cct}$ LEAKAGE CURRENT INTERRUPTER

[75] Inventors: James R. Ohannes, Portland; Stephen W. Clukey, South Portland, both of Me.

[73] Assignee: National Semiconductor Corporation, Santa Clara, Calif.

[21] Appl. No.: 932,354

[22] Filed: Aug. 19, 1992

[51] Int. Cl.$^5$ .................... H03K 17/16; H03K 19/094
[52] U.S. Cl. .................... 307/443; 307/451; 307/475; 307/446; 307/296.5; 307/296.8
[58] Field of Search .................... 307/443, 451, 296.8, 307/296.5, 475, 446

[56] References Cited
U.S. PATENT DOCUMENTS

| | | | |
|---|---|---|---|
| 4,501,978 | 2/1985 | Gentile et al. | 307/475 |
| 4,825,106 | 4/1989 | Tipon et al. | 307/475 |
| 5,001,365 | 3/1991 | Murabayashi et al. | 307/443 |
| 5,059,821 | 10/1991 | Murabayashi et al. | 307/443 |
| 5,066,875 | 11/1991 | Ueno et al. | 307/446 |
| 5,087,841 | 2/1992 | Rogers | 307/475 |

*Primary Examiner*—Edward P. Westin
*Assistant Examiner*—Richard Roseen
*Attorney, Agent, or Firm*—Thomas L. Bohan; Stephen R. Robinson

[57] ABSTRACT

An electronic switch to be used in BiCMOS circuitry when CMOS stages are controlled by logic output from (bipolar) TTL stages. Its purpose is to avoid the static leakage current $I_{cct}$ which can occur in a CMOS stage when the pulldown transistor is turned on while the pullup transistor is not completely turned off. This is a problem which arises when CMOS and TTL stages are coupled; the logic-high output from a TTL stage is sufficient in magnitude to turn on the CMOS pulldown transistor but not to turn off the CMOS pullup transistor. The present invention introduces an ancillary input to the subcircuit encompassing the CMOS input stage and also an ancillary output from one of the CMOS stages of the subcircuit (typically an output buffer) encompassing the TTL output stage. The ancillary output is chosen so as to provide a CMOS logic-high signal whenever the TTL stage is outputting a TTL logic-high signal. The ancillary input is connected to the control node of a switching transistor interposed between $V_{cc}$ and the CMOS input stage's pullup transistor. In this manner, the source of $I_{cct}$ is interrupted immediately after the CMOS stage is switched from pull-up mode to pull-down mode. The invention has particular applicability to latched transceivers, where the CMOS input stage is located in the latch circuit and the TTL in the tristate output buffer circuit.

15 Claims, 9 Drawing Sheets

$I_{cct}$ LEAKAGE CURRENT INTERRUPTER

BACKGROUND OF THE INVENTION

1. Field of the Invention

This invention relates generally to logic circuits combining TTL (bipolar transistor-transistor logic) stages with CMOS stages. More particularly, it relates to attempts to overcome the problems arising from mismatch between the amplitude of binary logic-high voltages for the two different types of stages. More particularly yet, it is directed at minimizing the leakage current ($I_{cct}$) arising in CMOS gates controlled by TTL-stage outputs, the logic-high voltages of which are inadequate to completely turn off PMOS pullup transistors. Most particularly, it relates to BiCMOS I/O pins for latched or clocked parts, where inputs must always be active (available to receive data).

2. Prior Art

In recent years great improvements have been made in logic circuitry through the development of completely integrated BiCMOS circuits able to exploit the advantages specific to both CMOS logic circuits-high input impedance, low power demand—and bipolar (TTL) logic circuits-high current sourcing/sinking capacity and speed. One of the consequences of combining CMOS and TTL is that, at one or more points in the operating circuit, output from a TTL stage may be the input to a CMOS circuit, at which point the disparity between the binary logic-high voltages of CMOS and TTL circuits, respectively, can give rise to difficulties.

CMOS binary logic voltages range rail to rail, i.e. GND to $V_{cc}$. For CMOS and BiCMOS circuitry, $V_{cc}$ is typically 5 volts so that, for CMOS circuitry, logic-low is typically 0 volts and logic-high is typically 5 volts. In contrast, logic-high for a TTL stage is typically $V_{cc}-2V_{BE}$, where $V_{BE}$ is the voltage drop across a forward-biased p-n junction. Since $V_{cc}-2V_{BE}$ is insufficient voltage to turn off a PMOS pullup transistor coupled to the high voltage power rail, a problem arises when the output from a TTL stage is used to control (i.e., turn on and turn off) a CMOS stage. (With a $V_{cc}$ of 5 volts, $V_{cc}-2V_{BE}$ is generally around 3.4 volts; nevertheless, depending on temperature and/or specific TTL output stage design, it can actually be less than 3 volts.) Thus, when the input to a CMOS stage is TTL-stage output, a logic-high signal-which should turn on a pulldown NMOS transistor while turning off a pullup PMOS transistor-will do the former while only incompletely turning off the pullup transistor. This results in a wasteful leakage current from $V_{cc}$ to GND passing through the pullup and pulldown transistors. This can be appreciated by reference to FIG. 1 (Prior Art), which shows the output portion of a BiCMOS buffer to the left and a CMOS input stage of another subcircuit to the right. The output signal from the (boxed) Darlington Pair comprising the current-sourcing part of the output stage of the TTL circuit to the left becomes the input data signal for the CMOS stage to the right when the left circuit is in its active mode. Binary logic-high for TTL output is $V_{cc}$ reduced by the forward drop of two diodes, for reasons that can be seen from FIG. 1. I.e., when the two transistors of the Darlington Pair are both conducting, $V_{out}$ is connected to $V_{cc}$ across a conducting bipolar transistor coupled to $V_{cc}$ across a forward biased Schottky diode. The combined circuit depends on this logic-high output turning off the PMOS pullup transistor QPX and turning on the NMOS pulldown transistor QNX. However, with the source and substrate of QPX tied to $V_{cc}$, as shown, the TTL logic-high signal ($V_{cc}-2V_{BE}$) will be insufficient to turn QPX completely off. It will, however, be sufficient to turn on QNX, with the result that there will be a coupling between $V_{cc}$ and GND through QPX and QNX while the TTL output/input is high. This wasteful leakage current is referred to by various names: "quiescent current," "static high current," and "static current $I_{cct}$." Its magnitude depends upon the channel sizes of QPX and QNX. Since it may be occurring simultaneously in many CMOS input stages, it can reach very high levels, extending into the milliamp range.

There are several prior art approaches to resolving the $I_{oct}$ problem. Two involve modifying the CMOS input stage and then using a multi-CMOS-stage translating sequence, so that the TTL input signal can be translated ultimately into a CMOS logic output signal in spite of the modification of the input stage. For example, a reduction in the effective high potential rail for the CMOS input stage enables the TTL logic-high to completely turn off the pullup transistor of the input stage. The effective reduction in the high potential side of the input stage can be accomplished by interposing several forward-biased diodes between $V_{cc}$ and the source node (and the bulk) of the input pullup transistor-which results in the input stage being coupled between a high potential of $V_{cc}-2V_{BE}$ and GND. With this expedient, a TTL high applied at the input is sufficient to completely cut off the input pullup transistor. The price paid, however, is that when a TTL low is input to the CMOS input stage, the resulting logic-high output to the next CMOS stage is only $V_{cc}-2V_{BE}$, and insufficient to turn off the pullup transistor of that next stage. In other words, the $I_{cct}$ problem has just been deferred from the initial CMOS stage to the next CMOS stage. (Because of performance specifications requiring that the ultimate output range is full rail-to- rail—GND to $V_{cc}$—it is not possible to simply lower the voltage of the high potential rail for the entire CMOS buffer.) The fix is indeed to lower the high potential side of the second CMOS buffer, but not by a full $2V_{BE}$. For the CMOS stage after that, the high potential rail is then back to $V_{cc}$ or close to it. Unfortunately, the series of translating stages and the potential-lowering diodes used in this approach introduce serious delays, significantly increasing the propagation time between the initial input to the first stage of the buffer and the final output. This elimination of $I_{cct}$ has been achieved at the cost of increasing the propagation time $T_p$.

The other prior art "sequential" approach is to accept a non-zero, though reduced, level of $I_{cct}$ in exchange for maintaining a better $T_p$. The high potential side is left untouched and the $I_{cct}$ of the initial stage is reduced by reducing the channel width of the input pulldown transistor. This ensures a small $I_{cct}$ in the CMOS input stage and also a full-scale logic-high output from this first stage. The problem created by this approach is that it is necessary to ultimately have large conduction channels in the pullup (and pulldown) transistors at the buffer output. Since it is impracticable to have a large channel width increase from one stage to the next, it is necessary to have a series of stages over which the width increases (by about a factor of three each time) until it is at the level required by the output stage. Consequently, the cost of dealing with $I_{cct}$ is again the need to have a sequence of CMOS stages. Furthermore, in this approach, $I_{cct}$ leakage has not been eliminated-only reduced, a residual $I_{cct}$ being accepted in a tradeoff for tolerable $T_p$.

An additional prosaic prior art approach to the $I_{cct}$ problem is to modify the TTL output stage, in a compromise intended to boost the TTL logic-high while still retaining some of the advantages of the bipolar output stage. It involves replacing the standard Darlington pair of bipolar transistors, in which by design the logic-high output is $V_{cc}-2V_{BE}$, with a single-transistor output. In order to compensate for the reduced current gain imposed by this change, the single transistor is chosen to be much larger than either of the two transistors in the Darlington pair. Even with this size increase, the output current available from this one-transistor stage is reduced considerably. (One problem is that the stage has a current gain of only $\beta$, compared with $\beta^2$ for the standard Darlington pair.) More seriously, these modifications result in increased noise-associated in part with the need to discharge a much higher capacitive energy at the bipolar transistor junction with and in increased demands on the limited space available on the die.

A variant on the "$V_{cc}$ reduction" approach reduces the high potential rail for the first CMOS stage, then introduces a feedback transistor to effectively boost the logic-high output for that stage to $V_{cc}$, thereby avoiding the use of a series of CMOS stages with varying logic-high levels. This approach is the subject of U.S. Pat. No. 5,087,841 (Rogers, 1992). As depicted in FIG. 2 (Related Art) with which sets out a circuit meant to receive TTL-stage output into $V_{IN}$ with the solution of Rogers is to combine the input-stage high-potential-rail reduction with a feedback loop. With the high potential rail for the input stage reduced to $V_{cc}-2V_{BE}$, the logic-high TTL output ($V_{cc}-2V_{BE}$) is sufficient to completely turn off the input-stage pullup transistor P1, eliminating $I_{cct}$. On the other hand, when the input stage is turned on (by a logic-low TTL signal at $V_{IN}$) P1 outputs a logic-high of only $V_{cc}-2V_{BE}$, which turns on the second-stage pulldown transistor N2 but is insufficient to completely turn off the second-stage pullup transistor P2. Nevertheless, once pulldown transistor N2 is turned on, the second stage output $V_2$ is pulled to ground and the feedback connection from that output back to the control node of the PMOS feedback transistor QF turns QF on and boosts the input signal to the second stage up to $V_{cc}$, resulting in P2 being turned off completely. Thus, in contrast to the circuit without the feedback transistor, where the reduced logic-high output from the input stage is unable to completely turn off the pullup transistor of the second stage—thus deferring the $I_{cct}$ leakage to that point—the design set out in FIG. 2 both eliminates $I_{cct}$ from the first stage—by lowering the high potential power rail voltage for that stage—and turns off the second stage pullup transistor completely. Unfortunately, for those applications which need extreme speed the 0.5 nsec or so lag time caused by the two junctions interposed between the high-potential power rail and the input stage stage is intolerable.

What is needed, then, is a method of completely eliminating $I_{cct}$ while: (1) not sacrificing $T_p$, (2) introducing no additional noise, and (3) not changing the structure of the TTL output stage.

SUMMARY OF PRESENT INVENTION

The present invention incorporates a variant on the feedback technique, but in such a way that no intermediate stages need be introduced and in such a way that there is no need to interpose potential-lowering, $T_p$-extending diodes or to deviate from the standard, efficient Darlington pair for the TTL output stage. Rather than varying effective $V_{cc}$ or PMOS channel width, the present invention provides a controllable switch for breaking the link between the input pullup transistor and the high potential power rail $V_{cc}$. With a properly synchronized control signal, this switch can be opened so as to interrupt the path for leakage current $I_{cct}$ from $V_{cc}$ to GND through the pullup and pulldown transistors of the CMOS input stage, after the CMOS input stage has responded to a logic-high input from the TTL output stage.

In the preferred embodiment of the present invention, the controllable switch is a PMOS "disconnect transistor" interposed between the pullup transistor of the CMOS input stage and the high voltage potential rail $V_{cc}$. That is, the input stage pullup transistor is coupled to the high voltage potential rail through a disconnect transistor that, when conducting, ensures that the pullup transistor's source node is at a voltage $V_{cc}$ and, when not conducting, ensures that no current can pass through the pullup transistor. The control signal is introduced through an ancillary input node coupled directly to the control node of the disconnect transistor. The signal required by the ancillary input is a CMOS logic-high (essentially $V_{cc}$) synchronized to the normal input signal so that—with appropriate delay to allow the CMOS stage to respond to its normal input—a voltage of $V_{cc}$ is applied to the disconnect transistor's control gate, and continues to be applied as long as the TTL logic-high normal input signal is present. This is shown schematically in FIG. 3, where $V_{ia}$ is the ancillary input node and PMOS transistor QPD is the switchable disconnect transistor (the switchable link). In BiCMOS circuitry with CMOS logic there are ample sources that can be tapped for the ancillary input signal. The output from any one of the CMOS invertor stages, properly synchronized and with proper isolation, can provide the required CMOS logic-high. Such a signal can, for example, be tapped off from a CMOS invertor in the BiCMOS sub-circuit generating the TTL logic-high output; it may also be tapped off from a CMOS invertor in the sub-circuit containing the CMOS input stage in question. The key requirement is that the signal phase be established (through choice of CMOS stage and/or the appropriate number of invertor/isolator buffers between that stage and $V_{ia}$), so that a CMOS logic-high signal appears at $V_{ia}$ immediately after the TTL logic high appears at the normal input node $V_{in}$.

A major area of applicability of the present invention is to BiCMOS transceivers and to latched transceivers in particular, devices used for mediating data exchange between different devices (such as CPUs and printers) where it is desired that data output from one device be held until called for by the other device. A block schematic of a standard latched transceiver with two input-/output (I/O) nodes A and B is shown in FIG. 4. It includes two BiCMOS three-state output buffers and two data latch circuits connected in a loop. FIG. 5 sets out the relevant elements of a typical BiCMOS three-state output buffer incorporating a bipolar output and a CMOS input structure. FIG. 6 shows a present latch circuit. It can be seen from comparing these structures with the generic latched transceiver schematic of FIG. 4 that $I_{cct}$ leakage current will occur in the input stages of the data latch circuits contained in BiCMOS latched transceivers.

For the configuration shown in FIG. 4 operated with typical voltages and other conditions, the $I_{cct}$ leakage current is approximately 0.25 ma per unit. On an octal board there will be eight identical units. An extended circuit may include many octal boards, and the resulting power drain due to $I_{cct}$ leakage will be correspondingly high. Because of this fact, the fact that latched transceiver circuits are fabricated on a single die, and the fact that speed must be maintained in these circuits, the present invention is a particularly useful modification to latched transceivers.

PREFERRED EMBODIMENT OF PRESENT INVENTION

Many applications of the present invention will be clear to those skilled in the relevant art. To a large extent, the breadth of utility of the present invention depends upon further integration (onto a single die) of BiCMOS circuits which are presently fabricated separately. In setting out the preferred embodiment under the current state-of-the-art of solid state circuitry, the inventors do not intend to imply any limitations on the ultimate forms of their invention.

Figure 1:
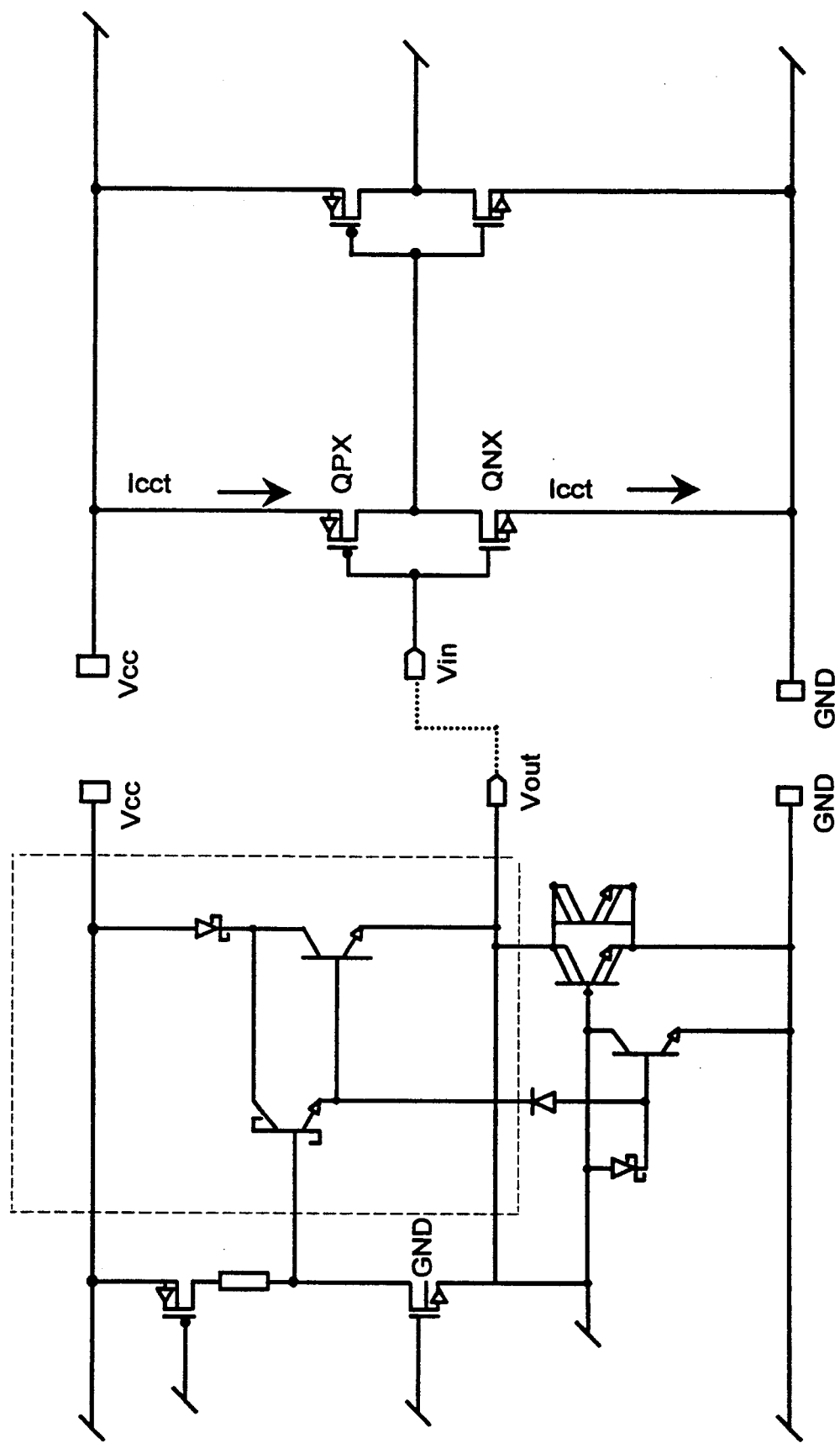
FIG. 1 uses a redimentary combination of a TTL output stage and a CMOS input stage to illustrate why $I_{cct}$ leakage current arises under this general category of coupling.
Figure 2:
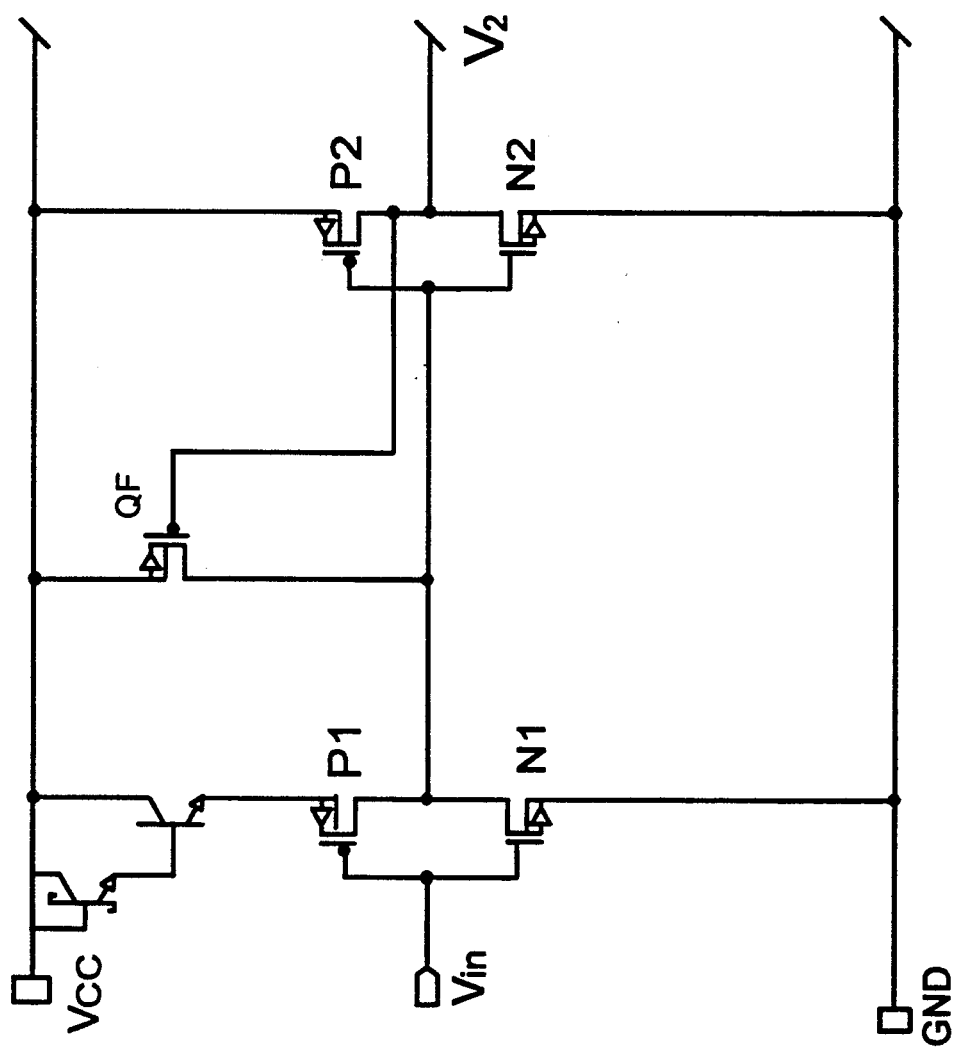
FIG. 2 illustrates a prior art approach which kills $I_{cct}$ in a CMOS input stage while using feedback methods to ensure full rail-to-rail CMOS logic input to subsequent CMOS stages.
Figure 3:
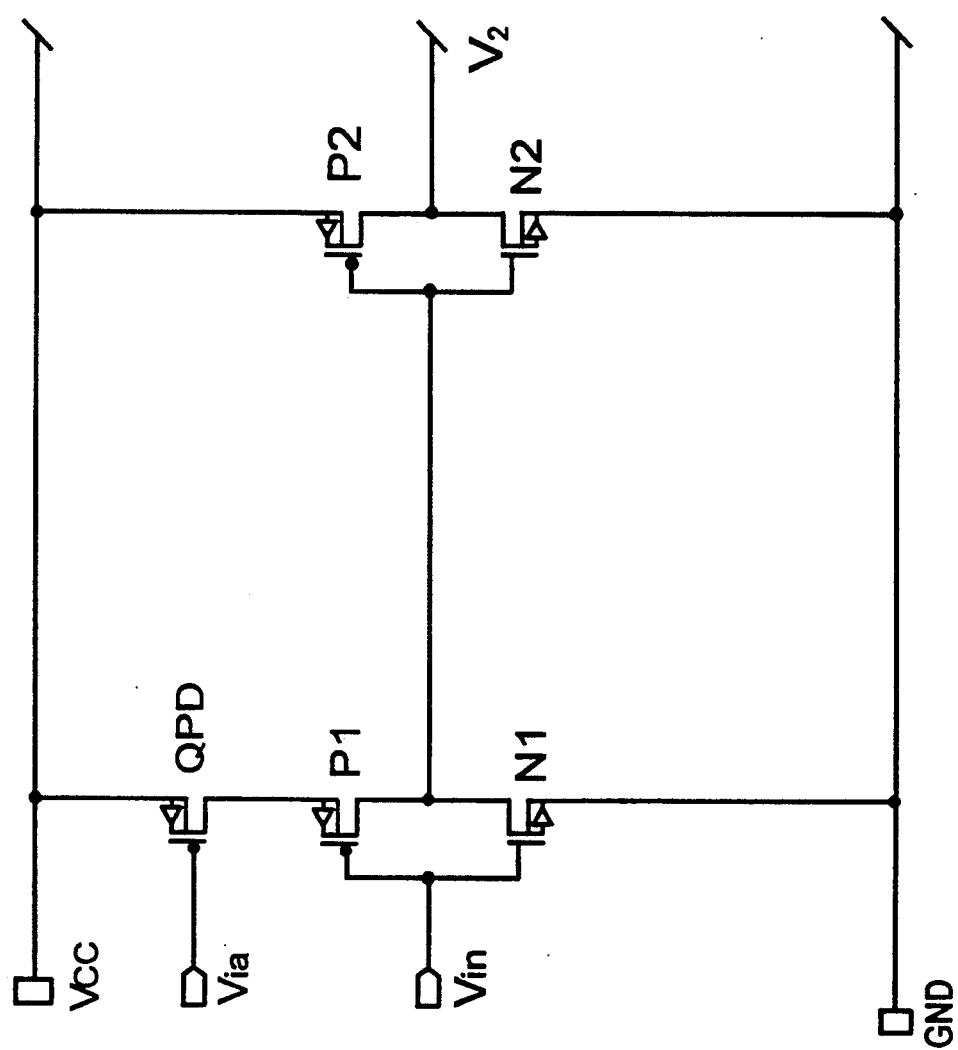
FIG. 3 illustrates in a general manner the method the present invention uses to eliminate $I_{cct}$.
Figure 4:
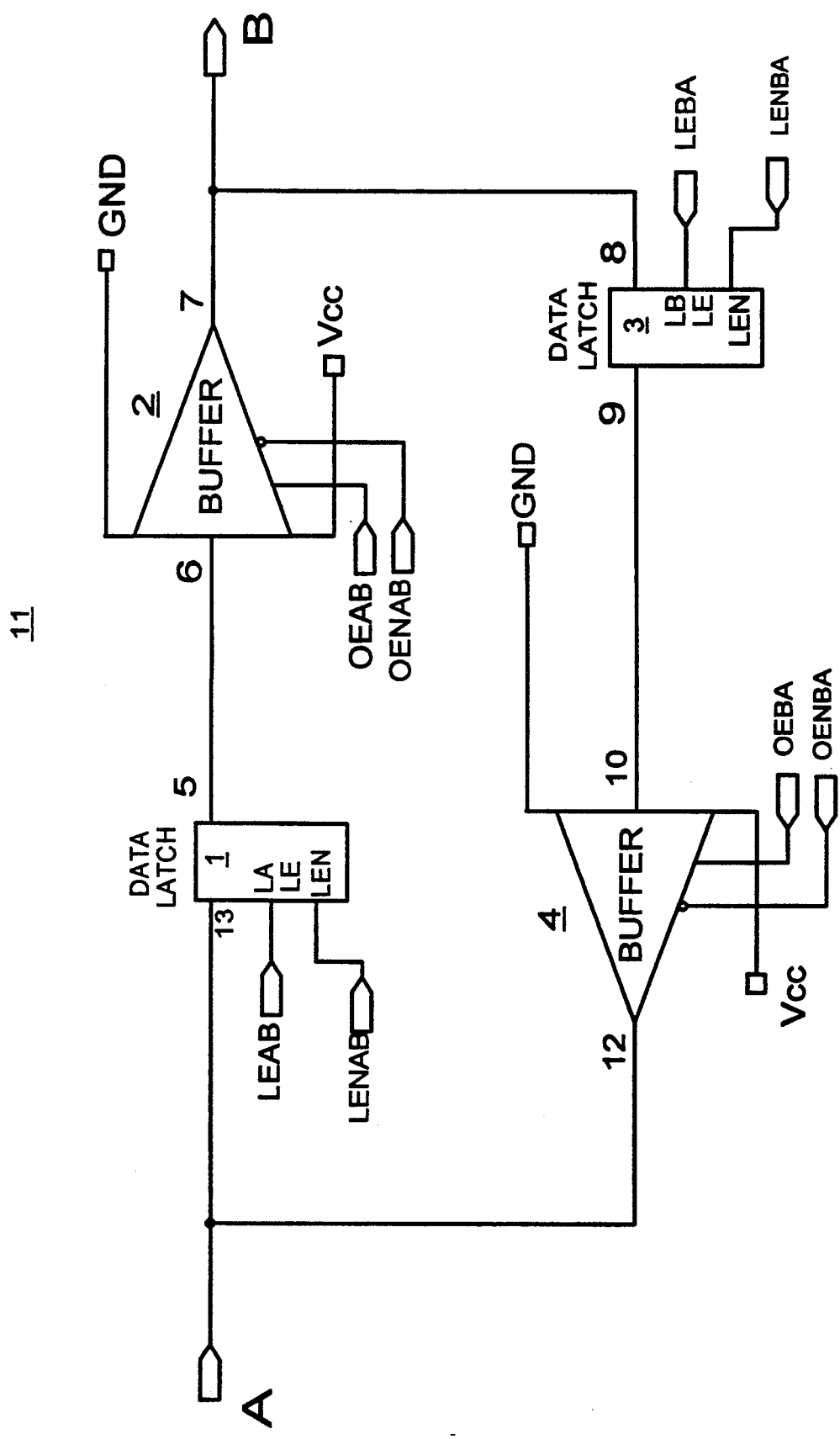
FIG. 4 is a block diagram of a generic prior art latched transceiver.

The preferred embodiment relates to latched BiCMOS transceivers incorporating three-state output buffers coupled to data latch circuits. FIG. 4 depicts a prior art latched transceiver circuit 11 incorporating a first data latch circuit 1, a first output buffer 2, a second data latch circuit 3, a second output buffer 4, a first input/out (I/O) node A, and a second I/O node B. As can be seen further from FIG. 4, a first latch output node 5 provides input to a first buffer input node 6, a first buffer output node 7 provides input to a second latch input node 8, a second latch output node 9 provides input to a second buffer input node 10, and the loop of said transceiver circuit 11 is completed by coupling a second buffer output node 12 to said first I/O node A which in turn couples directly into a first latch input node 13. Finally, it is noted that said first buffer output node 7 is directly coupled to said second I/O node B.

Figure 5:
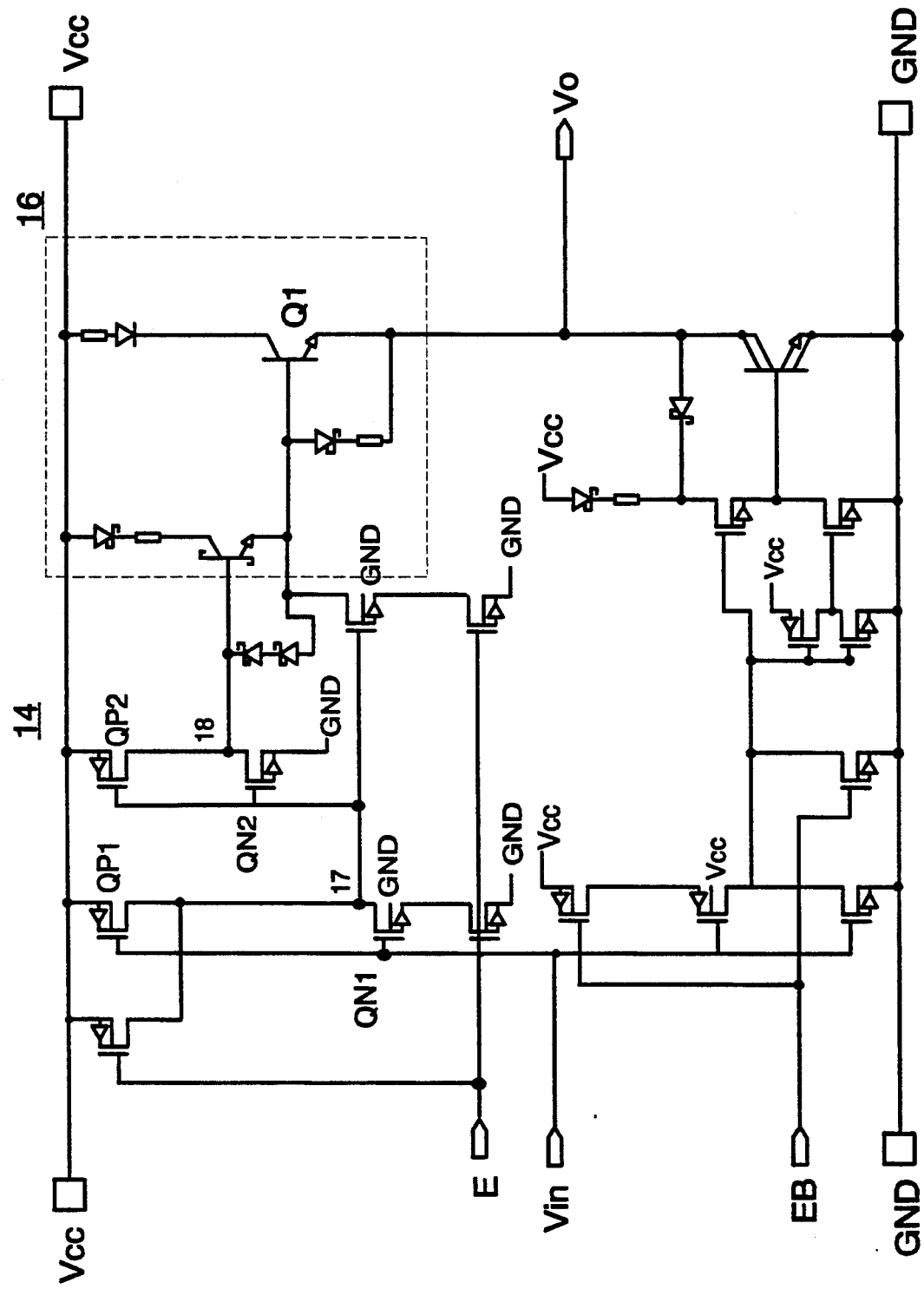
FIG. 5 is a circuit of a modern BiCMOS three-state output buffer, showing in particular the TTL output stages.

FIG. 5 depicts a BiCMOS three-state output buffer 14 coupled between a high potential power rail $V_{cc}$ and a low potential power rail GND and having a bipolar output pullup transistor Q1. Said bipolar output pullup transistor Q1 is one of a standard Darlington pair 16 (shown boxed) coupled into a buffer output node $V_o$. As can be seen, said output buffer 14 also comprises a CMOS input stage comprising an input pullup transistor QP1 and an input pulldown transistor QN1. A drain node of said input pullup transistor QP1 is tied in common with a drain node of said input pulldown transistor QN1 to a first intermediate output node 17. Said first intermediate output node 17 controls a second CMOS stage comprising a second stage pullup transistor QP2, a second stage pulldown transistor QN2, and a second intermediate output node 18. Said second intermediate output node 18 is coupled directly to and controls said Darlington pair 16. It can be seen from this that when a logic-high signal is introduced at input node $V_{in}$, a logic-high output signal $V_{oH}$ will appear—after propagation time $T_p$—at said buffer output node $V_o$. From FIG. 5, and in particular from said bipolar output pullup transistor Q1, it is seen that said logic-high output signal $V_{oH}$ will have a value of $V_{cc} - 2V_{BE}$, i.e., $V_{cc}$ reduced by the drop across two forward-biased p-n junctions: a diode D1 and a base-emitter junction of said bipolar output pullup transistor Q1. Said prior art three-state BiCMOS output buffer 14 is representative both of said first output buffer 2 and of said second output buffer 4 depicted in block form in FIG. 4.

Figure 6:
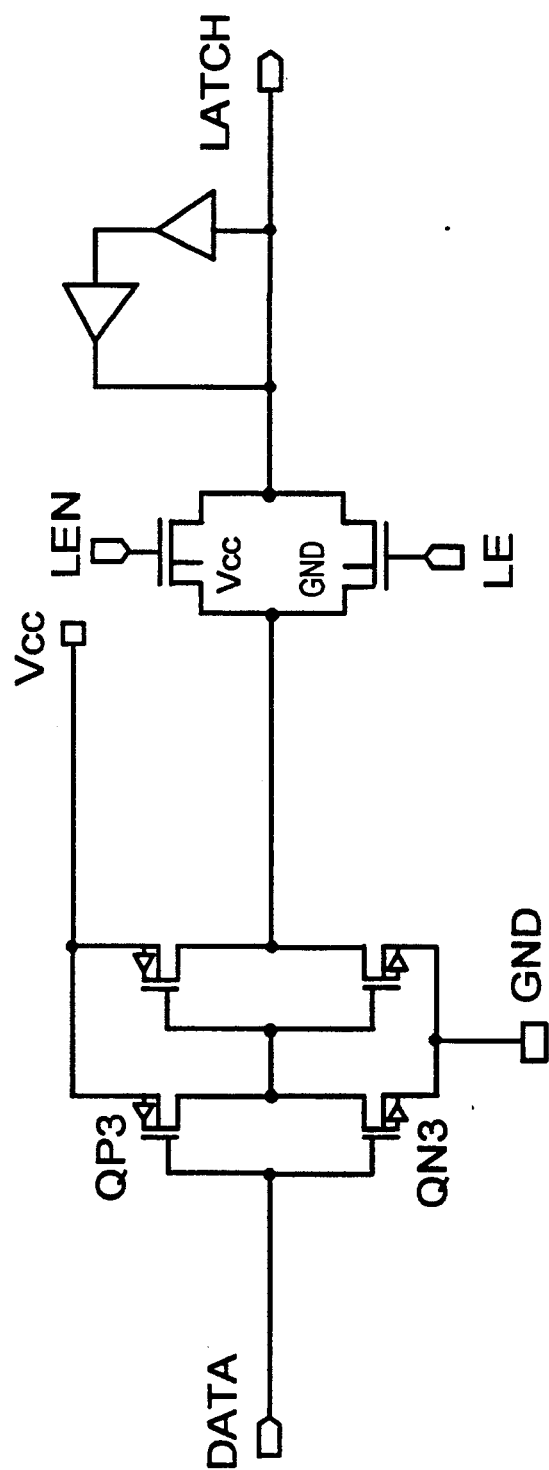
FIG. 6 is a diagram of a prior art data latch circuit.

FIG. 6 depicts a typical prior art data latch circuit 19 coupled between said high potential power rail $V_{cc}$ and said low potential power rail GND and comprising a latch input pullup transistor QP3 and a latch input pulldown transistor QN3. Since, within said prior art latched transceiver 11 illustrated in FIG. 4, coupling between said first buffer 2 and said second data latch 3—on the one hand—is identical to coupling between said second buffer 4 and said first data latch 1—on the other, all relevant circuitry can be discussed in terms of just a single buffer/latch coupling. As can be seen from FIG. 4, FIG. 5, and FIG. 6, said prior art latched transceiver depends upon logic-high output $V_{oH}$ from said first buffer output node $V_o$ or its equivalent turning off said latch input pullup transistor QP3 or its equivalent in both said first data latch circuit 1 and second data latch circuit 3. It can also be seen that said logic-high output $V_{oH}$ is inadequate to completely turn off said latch input pullup transistor QP3, which requires a control node voltage close to that of said high potential power rail $V_{cc}$ to be completely turned off. At the same time, said logic-high output $V_{oH}$ is sufficient to turn on said latch input pulldown transistor QN3 or its equivalent, resulting in substantial leakage current $I_{cct}$ flowing between said high potential power rail $V_{cc}$ and said low potential power rail GND through the link established by partial conduction of said latch input pullup transistor QP3 in series with full conduction of said latch input pulldown transistor QN3.

Figure 7:
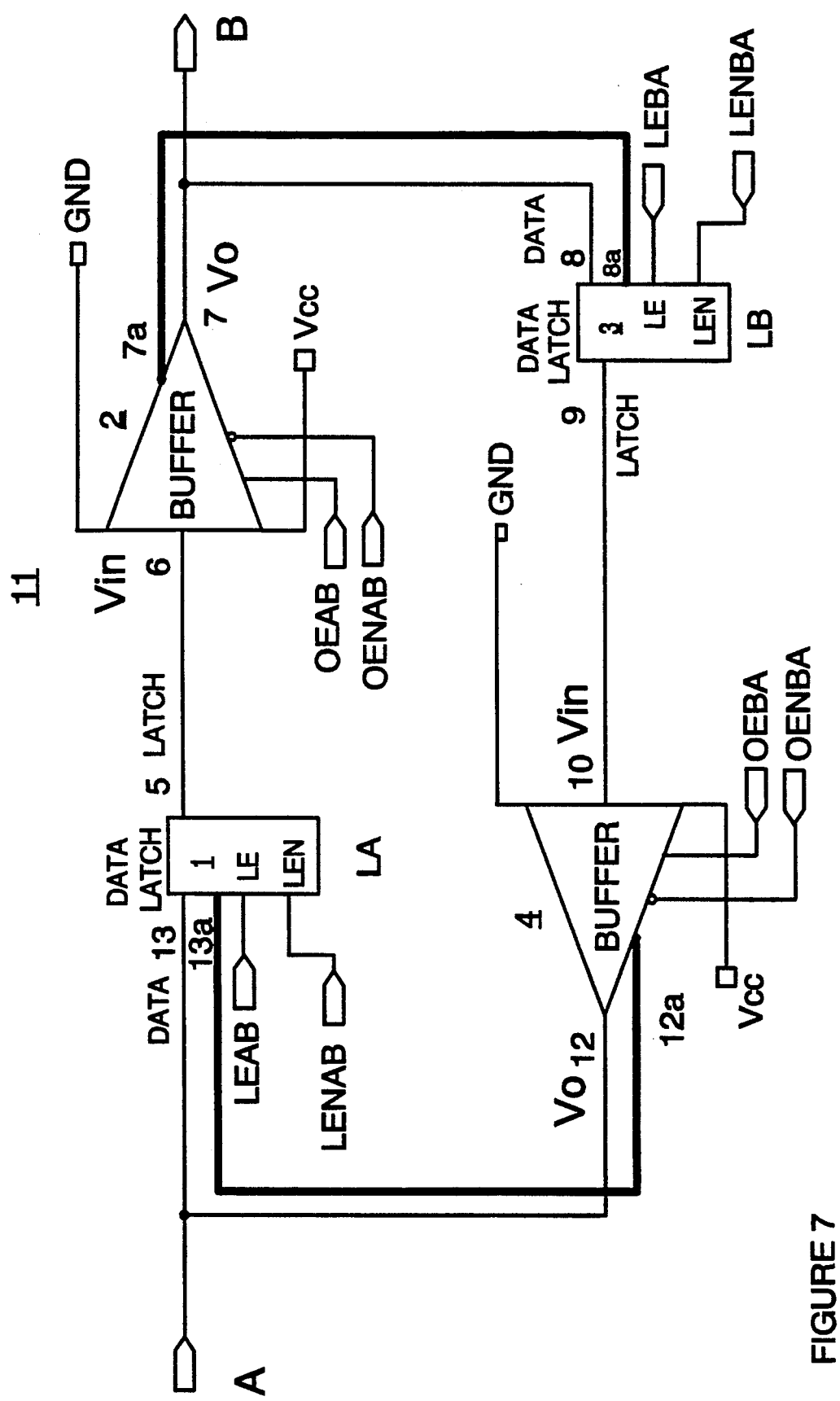
FIG. 7 is a block diagram of an improved latched transceiver, illustrating the present invention's ancillary inputs and outputs to the buffers and data latches.
Figure 8:
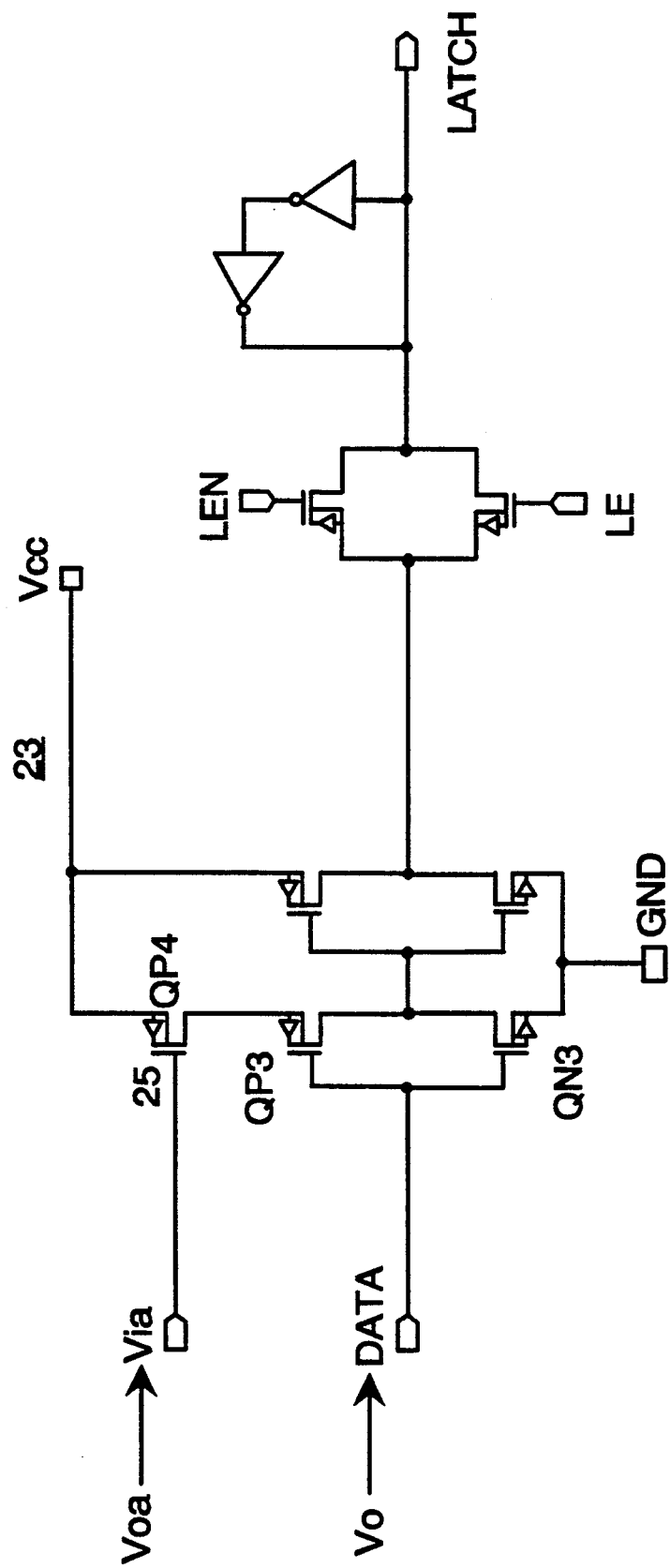
FIG. 8 is a diagram of a data latch circuit modified in accord with the present invention.
Figure 9:
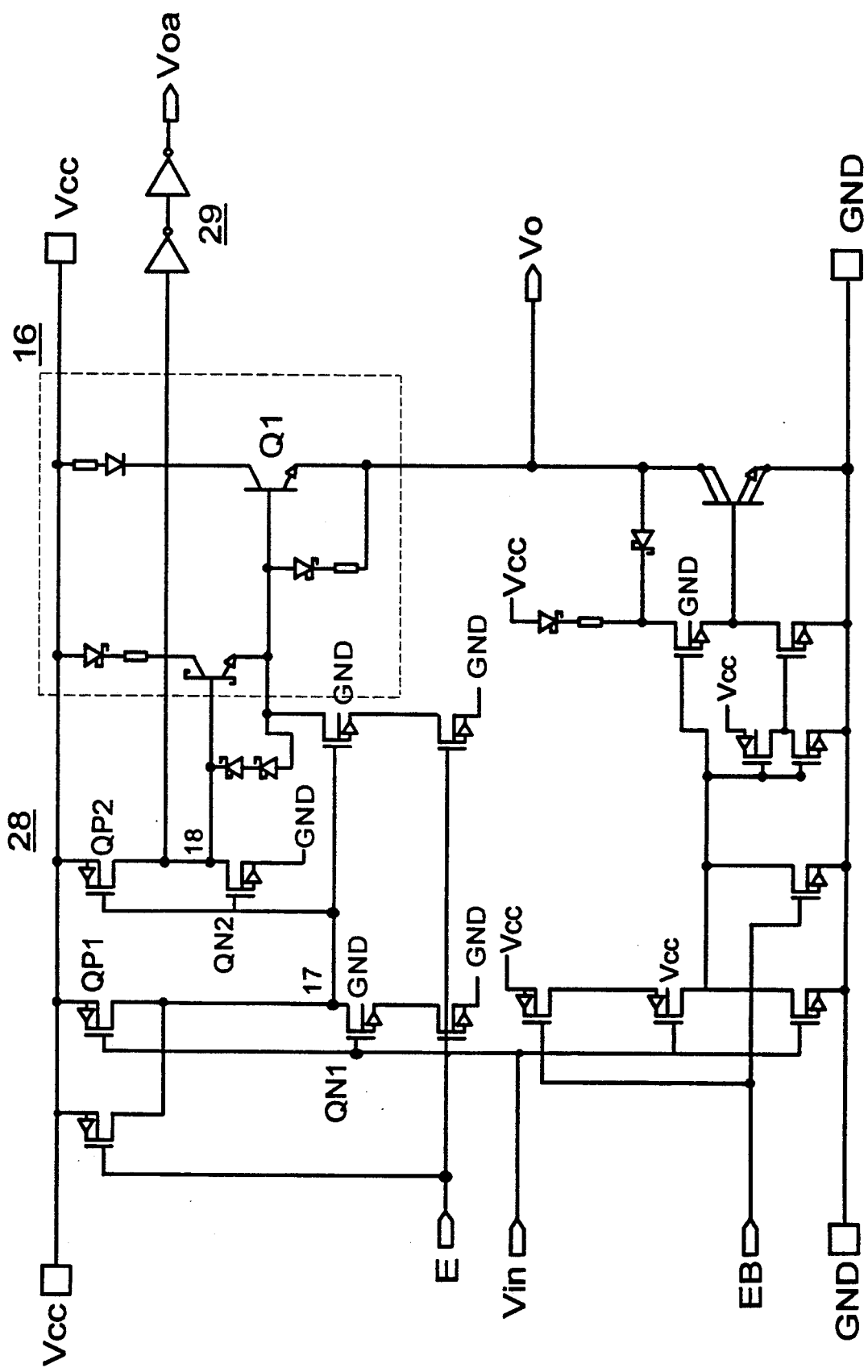
FIG. 9 is a diagram of a BiCMOS three-state output buffer, modified from the prior art in accord with the present invention.

The present invention as applied to latched transceivers is depicted in FIG. 7, FIG. 8, and FIG. 9. Those elements of FIGS. 7, 8, and 9 which are the same and which perform the same function as in the prior art have been assigned the same designations as were used in FIGS. 4, 5, and 6.

FIG. 7 is identical to FIG. 4 but for the addition of a "feed-forward" coupling provided by the preferred embodiment of the present invention. In particular, there is an ancillary first buffer output node 7a coupling into an ancillary second data latch input node 8a, an ancillary second buffer output node 12a coupling into an ancillary first data latch input 13a, all as depicted schematically in FIG. 7.

FIG. 8 depicts a new data latch circuit 23 comprising a control disconnect PMOS transistor QP4—with a disconnect control node 25—interposed between said power rail $V_{cc}$ and said latch input pullup transistor QP3. An ancillary data latch input node $V_{ia}$ couples directly to said disconnect control node 25. As can be seen and as was discussed more generally in the SUMMARY OF THE INVENTION, said control disconnect PMOS transistor QP4 interrupts said leakage current $I_{cct}$ when a CMOS logic-high voltage is applied to said disconnect control node 25. All that is required is that a CMOS logic-high signal be applied to said ancillary data latch input node $V_{ia}$. The required signal, with the required synchronization, is supplied by an ancillary buffer-output $V_{oa}$ of an improved three-state output buffer 28, as depicted in FIG. 9.

Said improved three-state output buffer 28 differs from said prior art tristate output buffer 14 depicted in FIG. 5 only by an additional output, said ancillary buffer-output $V_{oa}$, derived from said second intermediate output 18 within said improved three-state output buffer 28. More specifically, said ancillary buffer-output $V_{oa}$ is coupled through a pair of isolating/amplifying invertors 29 to said second intermediate output node 18 in such a way that a CMOS logic-high voltage appears at said ancillary buffer output $V_{oa}$ whenever a logic-high voltage is imposed on said buffer-input $V_{in}$. Thus, with said ancillary buffer output $V_{oa}$ coupled directly to said ancillary input node $V_{ia}$, said control disconnect PMOS transistor QP4 is turned completely off and said latch input pullup transistor QP3 is disconnected from said power rail $V_{cc}$. This ensures that any leakage current $I_{cct}$ which was initially enabled by a logic-high input $V_{oH}=V_{cc}-2V_{BE}$ will be interrupted within a time equal to or less than $T_p$, the propagation time of the circuit. Tests by the inventors on the preferred embodiment of the present invention indicate that $T_p$ is not increased overall by more than picosecond intervals by the addition of the described feed-forward links and associated circuitry to a latched transceiver circuit.

We claim:

1. A BiCMOS circuit and switching means for halting static leakage current $I_{cct}$ in CMOS input stages controlled by bipolar logic, said BiCMOS circuit comprising a CMOS input stage and a CMOS control stage
   wherein said CMOS input stage includes a CMOS input node, a PMOS pullup transistor having a pullup control gate, and an NMOS pulldown transistor comprising a pulldown control gate,
   wherein said pullup control gate and said pulldown control gate are coupled in common to said CMOS input node,
   wherein a drain node of said PMOS pullup transistor is coupled directly to a drain node of said NMOS pulldown transistor, and
   wherein a source node of said NMOS pulldown transistor is coupled directly to a low-potential power rail,
   wherein said CMOS control stage is an invertor stage included in said BiCMOS circuit and coupled between said high-potential power rail and said low-potential power rail,
   wherein said switching means for halting $I_{cct}$ static high leakage current includes a PMOS disconnect transistor and a plurality of isolation/amplification buffers in series
   wherein a disconnect control gate of said PMOS disconnect transistor is coupled to an output node of said CMOS control stage through said plurality of isolation/amplification buffers in series, and a source node of said PMOS pullup transistor is coupled to a high-potential power rail through said PMOS disconnect transistor,
   wherein said plurality of isolation/amplification buffers in series is of such a number as to ensure an even number of inversions between said output node of said CMOS control stage and said disconnect control gate while providing isolation necessary to avoid loading down said output node of said CMOS control stage.

2. A BiCMOS latched transceiver circuit comprising
   (a) a first data latch circuit,
   (b) a first BiCMOS three-state output buffer,
   (c) a second data latch circuit,
   (d) a second BiCMOS three-state output buffer,
   (e) a first latched transceiver I/O node, and
   (f) a second latched transceiver I/O node,
   wherein said first data latch circuit is coupled between a high-potential power rail and a low-potential power rail and has a first data input node coupled directly to said first latched transceiver I/O node, a first data latch CMOS input stage, a first latch intermediate stage, a first invertor loop, and a first latch output node,
      wherein said first data latch CMOS input stage includes a first latch input pullup transistor coupled to said high-potential power rail through a first disconnect transistor comprising a first disconnect control gate node coupled to a first ancillary input of said first data latch circuit,
   wherein said first BiCMOS three-state output buffer is coupled between said high-potential power rail and said low-potential power rail and includes (1) a first CMOS input stage having an output coupled through a plurality of invertor stages to a first CMOS control stage, and (2) a TTL output stage coupled to a first BiCMOS three-state output buffer output node,
      wherein said first CMOS control stage includes a first CMOS control stage output node coupled to a first ancillary output,
   wherein said second data latch circuit is coupled between said high-potential power rail and said low-potential power rail and includes a second data input node coupled directly to said second latched transceiver I/O node, a second data latch CMOS input stage, a second latch intermediate stage, a second invertor loop, and a second latch output node,
      wherein said second data latch CMOS input stage includes a second data latch input pullup transistor coupled to said high-potential power rail through a second disconnect transistor having a second disconnect input node coupled to a second ancillary input of said second data latch circuit,
   wherein said second BiCMOS three-state output buffer is coupled between said high-potential power rail and said low-potential power rail and includes a second CMOS input stage, a plurality of second CMOS invertor stages, a second CMOS control stage separated from said second CMOS input stage by an odd number of said plurality of second CMOS invertor stages and having a second CMOS control stage output node which is coupled to a second ancillary output, wherein said first ancillary output of said first BiCMOS three-state output buffer is connected to said second ancillary input of said second data latch circuit and said second ancillary output of said second BiCMOS three-state output buffer is connected to said first ancillary input of said first data latch circuit, and wherein an output node of said second BiCMOS three-state output buffer is connected to said first latched transceiver I/O node and said first BICMOS three-state output buffer is connected to said second latched transceiver I/O node wherein said first latch output node of said first data latch is connected to an input of said first CMOS input stage of said first BiCMOS three-state output buffer and said second latch output node of said second data latch is connected to an input of said second CMOS input stage of said second BiCMOS three-state output buffer.

3. In a BiCMOS circuit, $I_{cct}$-minimizing circuitry for limiting static leakage current $I_{cct}$ in a CMOS stage coupled between a high-potential power rail and a low-potential power rail wherein an input of said CMOS stage is coupled to a bipolar stage and to a control stage of a buffer, said $I_{cct}$-minimizing circuitry comprising:
   (a) a switchable link interposed between said CMOS stage and said high-potential power rail, and
   (b) an ancillary buffer output of said buffer coupled to said switchable link,
wherein an output node of said bipolar stage is coupled to said CMOS stage, and an output from said control stage is coupled to said ancillary buffer output.

4. $I_{cct}$-minimizing circuitry as claimed in claim 3 wherein said switchable link is a disconnect transistor connected between said potential rail $V_{cc}$ and a source of a pullup transistor of said CMOS stage.

5. $I_{cct}$-minimizing circuitry as claimed in claim 4 wherein said disconnect transistor is a PMOS transistor comprising a disconnect control gate node coupled to said ancillary buffer output.

6. $I_{cct}$-minimizing circuitry as claimed in claim 5 wherein said ancillary buffer output carries a signal derived from said output of said control stage, wherein said control stage is selected to have an output signal with phase identical to that of said output of said bipolar stage.

7. $I_{cct}$-minimizing circuitry as claimed in claim 6 wherein said connection between said disconnect control gate node and said output node of said control stage is made through two invertors in series.

8. An $I_{cct}$-minimizing improvement to a BiCMOS latched tranceiver comprising
   (a) a first data latch coupled between a high-potential power rail and a low-potential power rail,
   (b) a second data latch coupled between said high-potential power rail and said low-potential power rail,
   (c) a first three-state buffer coupled between said high-potential power rail and said low-potential power rail, and
   (d) a second three-state buffer coupled between said high-potential power rail and said low-potential power rail,
wherein said first data latch includes a first data input node coupled to a first CMOS input invertor stage, and a first data output node, wherein said second data latch includes a second data input node coupled to a second CMOS input invertor stage, and a second data output node, wherein said first three-state buffer includes a first buffer CMOS input invertor stage coupled into a first buffer intermediary CMOS invertor stage, and a first bipolar output stage coupled to a first buffer output node, wherein said second three-state buffer includes a second buffer CMOS input invertor stage coupled into a second buffer intermediary CMOS invertor stage, and a second bipolar output stage coupled directly to a second buffer output node, wherein said first buffer output node is connected to said second data input node, and wherein said second buffer output node is connected to said first data input node, wherein said first data output node is connected to said first buffer CMOS input invertor stage and said second data output node is connected to said second buffer CMOS input invertor stage said improvement comprising
   (a) a first PMOS disconnect transistor interposed between said first CMOS input invertor stage and said high-potential power rail, wherein said first PMOS disconnect transistor includes a first PMOS disconnect control gate node,
   (b) a second buffer ancillary output node coupled through two CMOS invertor stages in series to an output node of a second buffer control stage wherein said second buffer control stage includes said second buffer intermediary CMOS invertor stage,
   (c) a direct connection between said second buffer ancillary output node and said first PMOS disconnect control gate node,
   (d) a second PMOS disconnect transistor interposed between said second CMOS input invertor stage and said high-potential power rail, wherein said second PMOS disconnect transistor includes a second PMOS disconnect control gate node,
   (e) a first buffer ancillary output node coupled through two CMOS invertor stages in series to an output node of a first buffer control stage wherein said second buffer control stage includes said first buffer intermediary CMOS invertor stage,
   (f) a direct connection between said first buffer ancillary output node and said second PMOS disconnect control gate node.

9. BiCMOS circuitry with $I_{cct}$-minimizing mechanism for eliminating $I_{cct}$ leakage current in CMOS stages controlled by bipolar logic, said BiCMOS circuitry comprising
   (a) a CMOS stage comprising a CMOS input node coupled to a gate node of a PMOS pullup transistor and to a gate node of an NMOS pulldown transistor, wherein a drain node of said pulldown transistor is coupled directly to a low potential power rail GND, a source node of said pulldown transistor is coupled directly to a drain node of said pullup transistor, a source node of said pullup transistor is coupled directly to a drain node of a PMOS interrupt transistor, a source node of said interrupt transistor is coupled directly to a high potential power rail $V_{cc}$, and a control node of said interrupt transistor is coupled to an ancillary CMOS input node,
   (b) a bipolar stage comprising a Darlington pair coupled between said high power potential rail $V_{cc}$ and said low power potential rail and a bipolar output node coupled directly to said CMOS input node,
   (c) a separate CMOS stage capable of producing a CMOS logic-high voltage of $V_{cc}$ and a CMOS logic-low voltage of GND at a control output node coupled directly to a drain node of a separate pullup transistor of said separate CMOS stage, wherein said separate CMOS stage is positioned in said BiCMOS circuitry so as to ensure that any logic signal at said control output node is in phase with any logic signals produced by said bipolar stage,
wherein said control node is also coupled to said ancillary CMOS input node through two current-amplifying invertors in series.

10. A method of minimizing static leakage current $I_{cct}$ in CMOS stages of BiCMOS circuitry, comprising
  (a) coupling a CMOS stage between a high-potential power rail and a low-potential power rail wherein said CMOS stage is coupled to an output of a bipolar stage of a buffer,
  (b) coupling a switchable $I_{cct}$ link between said CMOS stage and said high-potential rail,
  (c) supplying to said switchable $I_{cct}$ link an on/off signal, wherein said on/off signal is selected to turn off said switchable $I_{cct}$ link during all periods of potential flow of said static leakage current $I_{cct}$ and to turn on said switchable $I_{cct}$ link during all other periods, wherein an output from a control stage of said buffer provides said on/off signal.

11. A method of minimizing static leakage current $I_{cct}$ as claimed in claim 10 wherein said switchable $I_{cct}$ link is a MOS transistor.

12. A method of minimizing static leakage current $I_{cct}$ as claimed in claim 11 wherein said MOS transistor is a PMOS transistor and is connected between said high-potential power rail and a source node of a pullup transistor of said CMOS stage and wherein said on/off signal is introduced through a control gate node of said PMOS transistor.

13. A method of minimizing static leakage current $I_{cct}$ as claimed in claim 12 wherein said on/off signal is derived from a CMOS invertor output node of said control stage.

14. A method of minimizing static leakage current $I_{cct}$ as claimed in claim 13 wherein said control gate node of said PMOS transistor is coupled directly to said CMOS invertor output node through a plurality of isolating invertors chosen to provide a correct phase to said on/off signal.

15. A method of minimizing static leakage current $I_{cct}$ in a CMOS stage of BiCMOS circuitry, wherein said CMOS stage comprises a PMOS pullup transistor coupled to an NMOS pulldown transistor and wherein said CMOS stage is coupled between a high potential power rail $V_{cc}$ and a low potential power rail GND, comprising
  (a) interposing a PMOS transistor switch between a source node of said PMOS pullup transistor and said high potential power rail $V_{cc}$,
  (b) coupling a control gate of said PMOS transistor switch to an output of a CMOS invertor stage of said BiCMOS circuitry through an isolating means comprising a plurality of CMOS invertors chosen so as to ensure that a logic-high CMOS voltage is applied to said control gate when said static current $I_{cct}$ would otherwise flow and so as to ensure that at all other times a logic-low CMOS voltage is applied to said control gate.

* * * * *